(12) United States Patent
Cooper et al.

(10) Patent No.: US 10,156,870 B2
(45) Date of Patent: Dec. 18, 2018

(54) FLEXIBLE ELECTROMAGNETIC INTERFERENCE (EMI) SHIELD

(71) Applicant: GOOGLE INC., Mountain View, CA (US)

(72) Inventors: James Cooper, San Francisco, CA (US); Joshua Norman Lilje, San Jose, CA (US)

(73) Assignee: GOOGLE LLC, Mountain View, CA (US)

( * ) Notice: Subject to any disclaimer, the term of this patent is extended or adjusted under 35 U.S.C. 154(b) by 63 days.

(21) Appl. No.: 15/010,125

(22) Filed: Jan. 29, 2016

(65) Prior Publication Data
US 2017/0220074 A1  Aug. 3, 2017

(51) Int. Cl.
| | | |
|---|---|---|
| *G06F 1/16* | (2006.01) | |
| *H05K 3/32* | (2006.01) | |
| *H05K 9/00* | (2006.01) | |

(52) U.S. Cl.
CPC ........... *G06F 1/1658* (2013.01); *H05K 3/321* (2013.01); *H05K 9/0022* (2013.01); *H05K 9/0032* (2013.01)

(58) Field of Classification Search
CPC ..... G06F 1/1658; H05K 3/321; H05K 9/0022
See application file for complete search history.

(56) References Cited

U.S. PATENT DOCUMENTS

| | | | | |
|---|---|---|---|---|
| 4,857,668 A | * | 8/1989 | Buonanno ............ | H05K 9/0015 174/354 |
| 5,202,536 A | * | 4/1993 | Buonanno ............ | H05K 9/0015 174/356 |
| 5,761,053 A | * | 6/1998 | King .................... | H01L 23/552 174/377 |

(Continued)

FOREIGN PATENT DOCUMENTS

| | | |
|---|---|---|
| WO | 9413123 A1 | 6/1994 |
| WO | 9414309 A1 | 6/1994 |

OTHER PUBLICATIONS

International Search Report and Written Opinion received for PCT Patent Application No. PCT/US2016/067018, dated Mar. 17, 2017, 13 pages.

*Primary Examiner* — Hoa C Nguyen
*Assistant Examiner* — Keith DePew
(74) *Attorney, Agent, or Firm* — Brake Hughes Bellermann LLP

(57) ABSTRACT

An electronic device may include a printed circuit board (PCB) including at least one electronic component, and an electrically conductive enclosure surrounding the at least one electronic component to provide electromagnetic interference (EMI) shielding for the at least one component. The electrically conductive enclosure may include a frame, made of a resilient, electrically conductive material, on a mounting surface of the PCB, surrounding the at least one component, and an electrically conductive shielding cover extending across an open top area defined by the frame. The frame may (Continued)

be attached to the PCB and the cover by an electrically conductive material to provide for electrical continuity. The frame may be made of a resilient, electrically conductive material so that the frame may compress in response to an externally applied force, and may return to an original, non-compressed form upon removal of the externally applied force.

24 Claims, 8 Drawing Sheets

(56) References Cited

U.S. PATENT DOCUMENTS

| | | | | |
|---|---|---|---|---|
| 6,178,318 B1 * | 1/2001 | Holmberg | | H05K 9/003 |
| | | | | 174/358 |
| 6,483,023 B1 * | 11/2002 | Jacques | | H05K 7/1425 |
| | | | | 174/358 |
| 7,078,092 B2 * | 7/2006 | Leerkamp | | H05K 9/0015 |
| | | | | 427/243 |
| 7,511,970 B2 | 3/2009 | Justason et al. | | |
| 7,763,810 B2 * | 7/2010 | van Haaster | | H05K 9/0015 |
| | | | | 174/357 |
| 8,907,229 B2 * | 12/2014 | Park | | H05K 3/3431 |
| | | | | 174/358 |
| 9,131,616 B2 * | 9/2015 | Wang | | H05K 1/0306 |
| 9,226,433 B2 * | 12/2015 | Cook | | H05K 9/0015 |
| 2006/0151207 A1 | 7/2006 | Redman et al. | | |
| 2013/0333941 A1 * | 12/2013 | Snider | | H05K 9/0043 |
| | | | | 174/535 |
| 2014/0268578 A1 * | 9/2014 | Dolci | | H05K 9/0049 |
| | | | | 361/719 |
| 2015/0124425 A1 | 5/2015 | An et al. | | |

* cited by examiner

FLEXIBLE ELECTROMAGNETIC INTERFERENCE (EMI) SHIELD

BACKGROUND

Electronic devices such as, for example, phones, tablets, laptop computers and the like, may include various different types of electronic components that emit electrical frequencies, causing electromagnetic interference (EMI) that may affect the operability of the electronic components of the device. Electromagnetic shielding of these components may reduce incoming and/or outgoing emission of electromagnetic frequencies to maintain operability of the components.

SUMMARY

In one aspect, an electronic device may include a printed circuit board (PCB), at least one electronic component on a mounting surface of the PCB, a frame having a first end electrically connected to the mounting surface of the PCB, surrounding the at least one electronic component, the frame being made of an elastic, electrically conductive material, and a cover electrically connected to a second end of the frame, the frame, the cover and the PCB defining an electrically conductive enclosure surrounding the at least one component. The frame may be configured to deform, from an initial state to a compressed state, in response to application of an external force, and is configured to return to the initial state in response to removal of the external force.

Implementations may include one or more of the following features, alone or in combination with one or more other features. For example, in some implementations, the device may include a first electrically conductive adhesive layer physically connecting and electrically connecting the first end of the frame to the PCB, and a second electrically conductive adhesive layer physically connecting and electrically connecting the second end of the frame to the cover. The elastic, electrically conductive material of the frame may include an elastic core and an electrically conductive sheath surrounding the elastic core. The electrically conductive sheath may be conformal to an outer periphery of the elastic core, the electrically conductive fabric sheath providing for electrical continuity between the PCB and the frame, and between the cover and the frame. The electrically conductive sheath is one of a fabric, a mesh, or a foil material. The core may be elastically deformable, the core being configured to absorb the external force as it deforms from the initial state to the compressed state, and to return to the initial state. The elastic core may be one of a foam material, a silicone material, or a urethane material. A cross section of the elastic core may be substantially constant along a length of the elastic core defining a contour of the frame surrounding the at least one electronic component on the mounting surface of the PCB. A cross section of the elastic core may vary along a length of the elastic core defining a contour of the frame surrounding the at least one electronic component on the mounting surface of the PCB. The elastic, electrically conductive material of the frame may be a metallized silicone material, including a silicone base material infused with conductive metal fibers. A contour of the frame may define a closed curve surrounding the at least one electronic component on the mounting surface of the PCB, the frame and the cover defining an electromagnetic interference (EMI) shield that inhibits EMI leakage from the at least one electronic component outside a volume defined by the frame, the cover and the mounting surface of the PCB.

In another aspect, an electronic device may include a PCB, at least one electronic component on a mounting surface of the PCB, an elastically deformable, electrically conductive frame on the mounting surface of the PCB, surrounding the at least one electronic component, the frame including an elastically deformable foam core and an electrically conductive flexible sheath surrounding the core, and an electrically conductive cover on the frame, the frame and the cover defining an electromagnetic interference (EMI) shield inhibiting EMI leakage from the at least one electronic component outside a volume defined by the frame, the cover and the mounting surface of the PCB.

Implementations may include one or more of the following features, alone or in combination with one or more other features. For example, in some implementations, the device the elastically deformable foam core of the frame may be configured to elastically deform, from an initial state to a compressed state, in response to application of an external force, to absorb the external force as it deforms from the initial state to the compressed state, and to return to the initial state in response to release of the external force. The electrically conductive flexible sheath may be conformal to an outer periphery of the elastically deformable foam core, the sheath providing for electrical continuity between the PCB and the frame, and between the cover and the frame.

In another aspect, a method may include mounting at least one electronic component on a mounting surface of a PCB, mounting an elastically deformable, electrically conductive frame on the mounting surface of the PCB, surrounding the at least one electronic component, with an electrically conductive adhesive physically and electrically connecting the frame and the PCB, and mounting an electrically conductive cover to the electrically conductive frame, with an electrically conductive adhesive physically and electrically connecting the frame and the cover. The frame and the cover may form an electromagnetic interference (EMI) shield that inhibits EMI leakage from the at least one component outside a volume defined by the frame, the cover, and the mounting surface of the PCB.

Implementations may include one or more of the following features, alone or in combination with one or more other features. For example, in some implementations, the method may include electrically connecting and physically connecting the frame and the mounting surface of the PCB using an electrically conductive adhesive to provide for electrical continuity between the PCB and the frame, and electrically connecting and physically connecting the frame and the cover using an electrically conductive adhesive to provide for electrical continuity between the frame and the cover. In some implementations, the frame and the cover may define an electrically conductive enclosure surrounding the at least one component. The frame may be configured to elastically deform, from an initial state to a compressed state, in response to application of an external force, and is configured to return to the initial state in response to release of the external force.

The details of one or more implementations are set forth in the accompanying drawings and the description below. Other features will be apparent from the description and drawings, and from the claims.

DETAILED DESCRIPTION

Figure 1A:
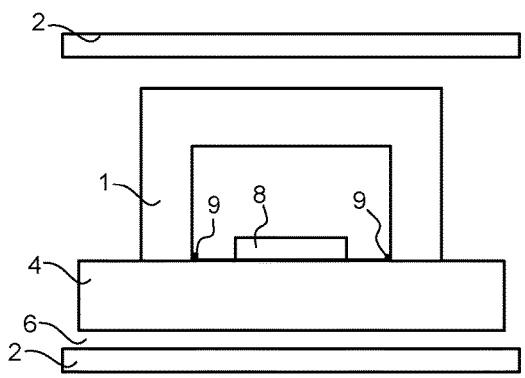
FIGS. 1A-1D are side sectional views of portions of example electronic devices.
Figure 1C:
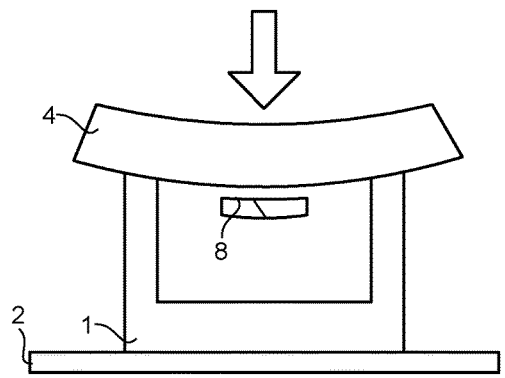
Figure 1B:
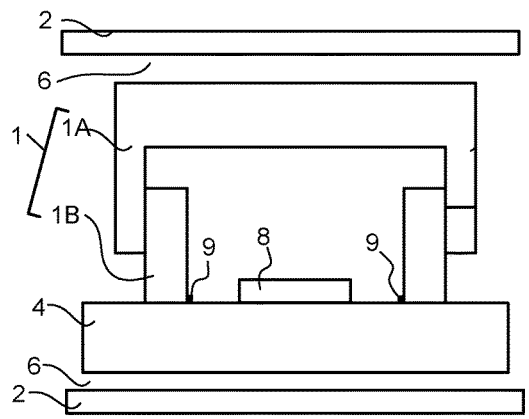
Figure 1D:
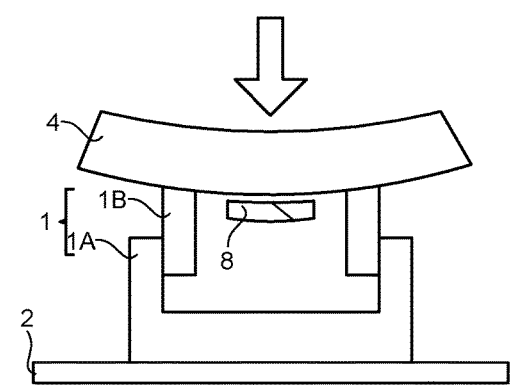

Electronic components (for example, central processing units (CPUs) and the like) of an electronic device, such as, for example, a smartphone, a tablet, a notebook/laptop computer and the like, may be fragile, and may be damaged when an external load and/or impact is applied to an exterior housing of the device in which the electronic component is received. As shown in FIG. 1A, an EMI shield 1 may be positioned around one or more electronic components 8 mounted on a printed circuit board (PCB) 4, and coupled to the PCB 4 by, for example, solder 9, to inhibit incoming and/or outgoing emission of electromagnetic frequencies and prevent degradation in operability of the electronic components housed within a housing 2 of the device. As shown in FIG. 1B, the EMI shield 1 may include an EMI shield cover 1A coupled to an EMI shield frame 1B, with the frame 1B mounted on the PCB 4. The EMI shields 1 shown in FIGS. 1A and 1B may include a relatively rigid structure, such as, for example, a metal structure, surrounding the electronic component(s) 8, along with a relatively large air gap 6, to prevent damage to the electronic components due to an external impact. While a rigid EMI shield 1 may provide the desired EMI shielding, this larger air gap may increase the vertical stack of components of the device, thus increasing the overall vertical thickness of the device and/or driving a need for thinner stacks of components within the device to compensate for the air gap, for a device of constant thickness. If the air gap 6 is reduced or substantially eliminated to reduce the overall vertical thickness of the device, and/or the housing 2 deforms in response to an external impact, the rigidity of this type of metal EMI shield 1 may cause the PCB 4 to bend and/or deform in response to an external impact, as shown in FIGS. 1C and 1D, thus damaging the electronic component(s) 8 and/or breaking the solder connections 9 between the component(s) 8 and the PCB 4.

An electrically conductive enclosure providing for EMI shielding, in accordance with embodiments as described herein, may include a resilient, or compliant, or elastic, electrically conductive frame mounted on a printed circuit board (PCB), surrounding the electronic component(s), with a shielding panel extending across an open end of the resilient, electrically conductive gasket so as to enclose the electronic component(s), the resilient, electrically conductive gasket and the shielding panel forming an electrically conductive enclosure, or EMI shield, or Faraday cage, surrounding the electronic component(s). In response to an externally applied force, for example, a force applied to the housing of the device, the elastic/resilient gasket may compress, or deform, thus absorbing the force of the external impact and protecting the electronic component(s), rather than transferring the external impact to the PCB and damaging the electronic component(s). Upon removal of the externally applied force, the elasticity of the resilient material may allow the frame to return to its form prior to application of the external force.

Figure 2A:
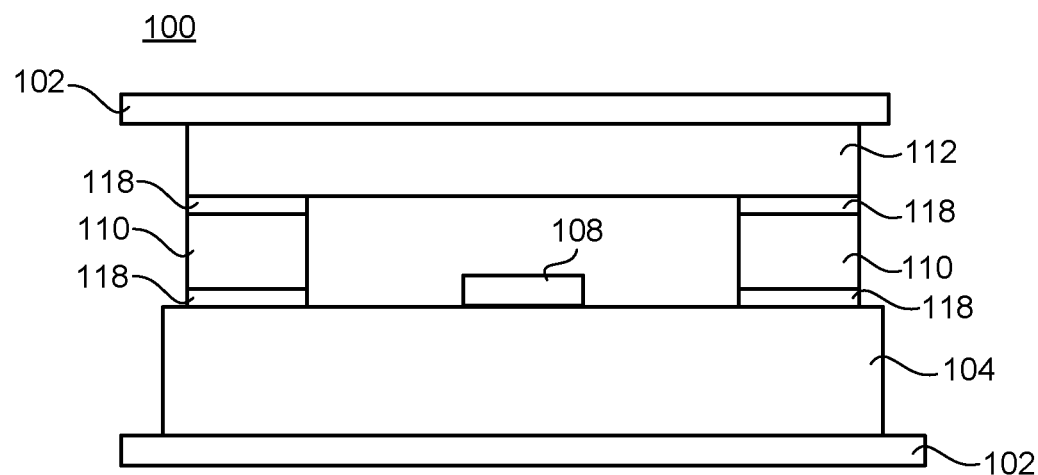
FIG. 2A-2D are side sectional views of a portion of an electronic device, in accordance with embodiments as described herein.

FIG. 2A is a cross sectional schematic view of an electronic device 100, in accordance with embodiments as described herein. As noted above, the electronic device 100 may be, for example, a mobile phone, a tablet, a laptop/notebook computer, or other type of electronic device including one or more EMI shields for electronic components of the device 100. As shown in FIG. 2A, a PCB 104 may be mounted on a rigid surface 102 of the device 100. The rigid surface 102 may be, for example, an interior facing side of a housing 102 of the device 100, a battery of the device 100, a rear facing surface of a display of the device 100, or other rigid surface of the device 100 positioned adjacent to the PCB 104. In some implementations, the PCB 104 may be directly connected to the rigid surface 102. In some implementations, the PCB 104 may be connected to one or more intermediate members that are, in turn, connected to the rigid surface 102.

A plurality of conductive electrical traces may be defined on the PCB 104, connecting different electronic components and/or different elements of the same electronic component. One or more electronic components 108, for example, an integrated circuit (IC), a central processor, a graphics processor, and the like, may be mounted on the PCB 104. The electronic component(s) 108 may generate EMI which, if not shielded, may affect the operability of other electronic components of the device 100. To reduce the amount of EMI that is radiated from the electronic component(s) 108 to other components within the electronic device 100, and/or to reduce the amount of EMI that is radiated from other components of the electronic device to the electronic component(s) 108 mounted on the PCB 104, an electrically conductive enclosure (a Faraday cage) may surround the electronic component(s) 108 on the PCB 104.

The electrically conductive enclosure may be defined by a resilient, elastic, electrically conductive frame 110 positioned on the mounting surface of the PCB 104, surrounding the electronic component(s), and an electrically conductive EMI shielding cover 112 that extends across a top of the frame 110, enclosing the electronic component(s) 108 within the space defined by the frame 110, the EMI shielding cover 112 and the mounting surface of the PCB 104. As shown in the example implementation illustrated in FIGS. 2A-2D, the resilient, elastic, electrically conductive frame 110 may attached to the surface of the PCB 104, and to the electrically conductive EMI shielding cover 112 by an electrically conductive material such as, for example, layers of electrically conductive adhesive material 118, which may maintain electrical continuity through the PCB 104, the electrically conductive frame 110 and the electrically conductive EMI shielding cover 112. In some implementations, other types of connections, such as, for example, solder, brazing, mechanical fasteners, or methods, may be used to maintain electrical continuity through the PCB 104, the frame 110 and the EMI shielding cover 112, to complete the Faraday cage and provide for EMI shielding of the electronic component(s) 108. In some implementations, the frame 110 may be positioned on a planar surface of the PCB 104, as shown in FIGS. 2A-2D. In some implementations, the frame 110 may be positioned in a groove formed in the mounting surface of the PCB 104 to accommodate the frame 110.

FIGS. 3A-3D are top views of various example implementations, with the electrically conductive EMI shielding cover 112 removed so that the arrangement of one or more components on the PCB 104, and the contour of the resilient, electrically conductive frame 110 surrounding the components 108 is visible. These views are just exemplary, meant to illustrate that the arrangement of component(s) 108 and the shape of the frame 110 surrounding the component(s) may vary, based on a particular implementation.

The resilient, electrically conductive frame 110 may be made of an electrically conductive, pliable, resilient, elastic material, which may be compressed in response to an external force, and which, due to its elastic qualities, may return substantially to its previous form upon removal of the external force. The frame 110 may be connected to the PCB 104 by an electrically conductive material as described above. A frame 110 made of an electrically conductive, pliable, elastic material may be more durable and less likely to snap or break in response to an externally applied force transmitted to the frame 110, as such a frame 110 may absorb the applied force, rather than allowing that force to be transferred to the PCB 104. In some implementations, this type of electrically conductive frame 110, made of an electrically conductive, pliable, resilient, elastic material may not only provide for electrical continuity between the PCB 104 and the EMI shielding cover 112, but may also provide for grounding and/or serve as a grounding pad. In some implementations, a frame 110 made of an electrically conductive, pliable material may be lighter than a frame made of a metal material, and due to its conformal qualities, may also be thinner than a frame made of a metal material. In some implementations, the conformal qualities afforded by the use of a pliant material for the frame 110 may allow for a contour of the frame 110 to be adjusted based on a particular arrangement of component(s) 108 on the PCB 104 to reduce the space occupied on the mounting surface of the PCB 104 for EMI shielding, as shown in FIGS. 3A-3D. The conformal qualities afforded by the use of a pliant material for the frame 110 may also allow a cross section of the frame 110 to be tapered, customized, or otherwise adjusted based on the component(s) 108 to be shielded and the arrangement of the component(s) 108, also reducing space occupied on the mounting surface of the PCB 104 for EMI shielding.

In some implementations, the frame 110 may include a fabric over foam gasket, including an electrically conductive material 114 such as a fabric or foil material surrounding a pliable, elastic extruded foam core 116. In the cross sectional view of the device 100 shown in FIGS. 2A-2D, the extruded foam core of the fabric over foam gasket defining the frame 110 has a substantially rectangular cross section. However, this is just one example of a fabric over foam gasket which may be used to form the frame 110. The foam core 116 may have various other cross sectional shapes, as shown in FIGS. 4A-4F such as, for example, a circular cross section, an oval cross section, a trapezoidal cross section, a variety of other, irregularly shaped cross sections, and the like. In some implementations, the cross section of the fabric over foam gasket may vary along the length of the gasket as it surrounds the component(s) 108 on the PCB 104, depending, for example, on a particular positioning and/or size and/or shape of the component(s) 108 and other component(s) positioned outside the frame 110, EMI characteristics and shielding requirements of the component(s) 108, and other such factors.

In some implementations, the electrically conductive frame 110 may be made of a metallized silicone material, including metal fibers dispersed throughout a silicone material, providing for electrical continuity between the PCB 104 and the electrically conductive EMI shielding cover 112. As with the fabric over foam gasket discussed above, the frame 110 made of a metallized silicone material may also have a variety of different cross sectional shapes, which in some implementations may vary along the length of the frame 110 surrounding the electronic component(s) 108 on the PCB 104.

In some implementations, a length of the frame 110 may be, for example, between approximately 2 mm and 200 mm. In some implementations, the length of the frame may be less than 2 mm, or greater than 200 mm. In some implementations, a width of the frame 110 may be between approximately 2 mm and 200 mm. In some implementations, the width of the frame may be less than 2 mm, or greater than 200 mm. In some implementations, a height of the frame 110 may be between approximately 0.2 mm and 20 mm. In some implementations, a height of the frame may be less than 0.2 mm or greater than 20 mm. In some implementations, the dimensions of the frame 110, for example, the height of the frame 110 and placement of the frame 110 relative to the component(s) 108 may be set so as to minimize an overall vertical stack while still providing for full functionality of the device.

Electrical conductivity of the electrically conductive frame 110 may be set based on numerous factors, including, for example, a level of electrical conductivity sufficient to shield the EMI emitted by the component(s) 108, to preserve operational functionality of the component(s) 108 and neighboring components of the device. In some implementations, the electrical conductivity of the electrically conductive frame 110 may be, for example, greater than or equal to approximately 1 S/m (siemens per meter). For example, in some implementations, the electrical conductivity of the frame 110 may be within a range of 1 S/m and $10^{10}$ S/m.

In some implementations, an amount of compression and/or deflection sustainable by the frame 110, for example, an amount of compression sustainable by the material of the core 116 shown in FIGS. 2A-2D, in response to an externally applied force while retaining the ability to return to its previous form upon removal of the external force, may be based on, for example, a size of the frame 110/core 116, a cross sectional shape of the frame 110/core 116, a particular material included in the frame 110/core 116, and other such factors. For example, in some implementations, the frame 110/core 116 may sustain compression of between approximately 4.0 Kg/m and 15 Kg/m while retaining the ability to return to its previous form. In some implementations, the frame 110/core 116 may sustain compression of greater than 15 Kg/m while retaining the ability to return to its previous form. In some implementations, the frame 110/core 116 may sustain deflection of between approximately 20% and 75% while retaining the ability to return to its previous form. In some implementations, the frame 110/core 116 may sustain deflection of greater than 75% while retaining the ability to return to its previous form.

The EMI shielding cover 112 may be made of an electrically conductive material, and may be connected to the frame 110 by an electrically conductive material as described above. In some implementations, the EMI shielding cover 112 may be made of an electrically conductive fabric, film, or foil material extending across the open area defined by the top of the frame 110. Pliability of the EMI shielding cover 112 made of a conductive fabric, film, or foil material may allow the cover 112 to be relatively easily and reliably applied to the frame 110, particularly in a situation in which a contour of the frame 110 may be somewhat irregularly shaped. This may help ensure electrical connectivity and continuity between the frame 110 and the cover 112, and may provide for a reliable seal between the frame 110 and the cover 112, further limiting the undesired ingress and/or egress of electromagnetic frequencies. In some implementations, the EMI shielding cover 112 may be made of a material including, for example, graphite, aluminum, copper, steel, nickel, silver, gold, tungsten, zinc, lead, tin, and other such materials providing electrical conductivity.

In some implementations, the EMI shielding cover 112 may be made of an electrically conductive, relatively rigid material, such as a conductive metal material. In some implementations, the EMI shielding cover 112 may be made of a metal material that is not just electrically conductive but also thermally conductive, to provide for heat dissipation in addition to EMI shielding. For example, in some implementations, the EMI shielding cover may be made of copper, aluminum, silver, or other metal material, including alloys so that the EMI shielding cover is both electrically conductive and thermally conductive. Numerous other metal materials may also provide for both electrical conductivity and thermal conductivity.

In some implementations, a thickness of the EMI shielding cover 112 may be set so that the cover 112 will deform, or bend, if necessary, but not break, when the cover 112 is handled and/or otherwise subjected to an external force. A thickness of the EMI shielding cover 112 may be different, based on the material selected for the cover 112. For example, in some implementations, a thickness of the cover may be between approximately 0.001 mm and 1.0 mm.

In some implementations, the electrical conductivity of the electrically conductive EMI shielding cover 112 may be set based on numerous factors, including, for example, a level of electrical conductivity sufficient to shield the EMI emitted by the component(s) 108, to preserve operational functionality of the component(s) 108 and neighboring components of the device. For example, in some implementations, the electrical conductivity of the electrically conductive EMI shielding cover 112 may be greater than or equal to approximately 1 S/m. For example, in some implementations, the electrical conductivity of the frame 110 may be within a range of 1 S/m and $10^{10}$ S/m.

As noted above, frame 110 may be secured to the PCB 104 in a variety of different ways to provide for electrical continuity between the PCB 104 and the frame 110. For example, the frame 110 may be adhered to the PCB 104 by an electrically conductive adhesive material, may be soldered or brazed to the PCB 104, may be mechanically secured to the PCB 104 by a fastener such as, for example, screws, bolts, rivets, snap-fit members, and the like, or other attachment method that provides for electrical continuity between the PCB 104 and the frame 110. Similarly, the EMI shielding cover 112 may be secured to the frame 110 in a variety of different ways to provide for electrical continuity between the frame 110 and the EMI shielding cover 112. For example, the cover 112 adhered to the frame 110 with an electrically conductive adhesive material, may be soldered or brazed to the frame, may be mechanically secured to the frame 110 by a fastener such as, for example, screws, bolts, rivets, snap-fit members, and the like, or other attachment method that provides for electrical continuity between the cover 112 and the frame 110.

The conformal qualities afforded by the use of a pliant, resilient, elastic material for the electrically conductive frame 110 may allow the frame 110 to deform and absorb an externally applied force that may otherwise cause damage to the PCB 104 and electronic component(s) 108 mounted on the PCB 104, as shown FIGS. 1C and 1D, when the externally applied force is transferred to the PCB 104 rather than absorbed by the frame 110. The elastic qualities may allow the frame 110 to return to its previous form upon removal of the externally applied force.

Figure 2B:
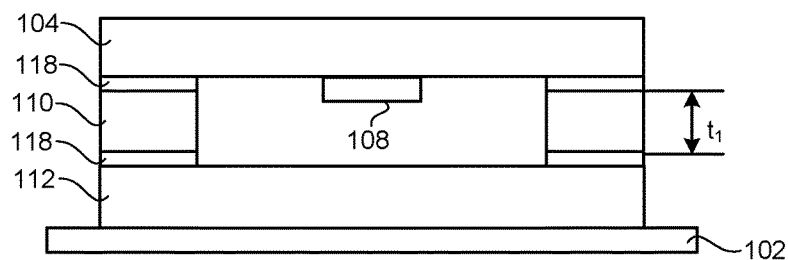
Figure 2C:
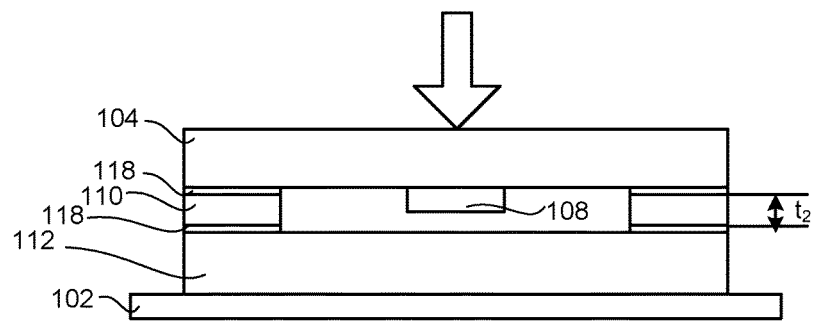
Figure 2D:
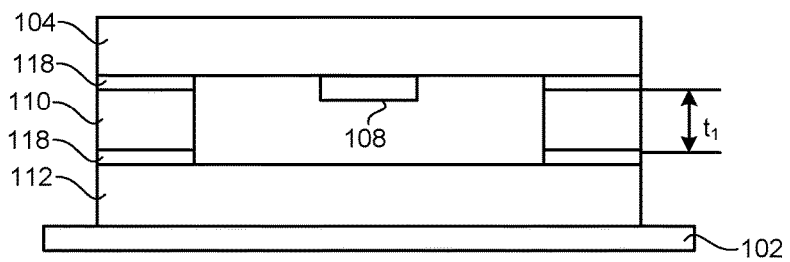
Figure 3A:
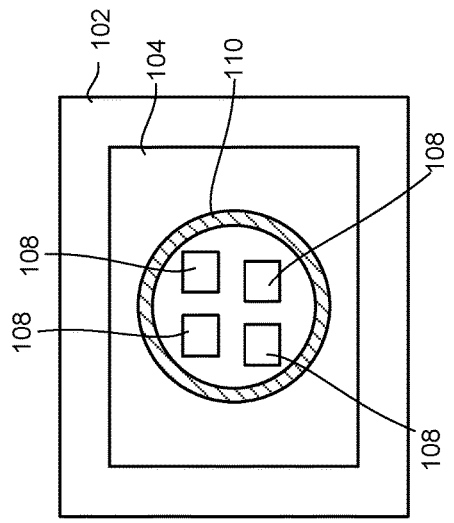
FIGS. 3A-3D are top views of portions of electronic devices, in accordance with embodiments as described herein.
Figure 3B:
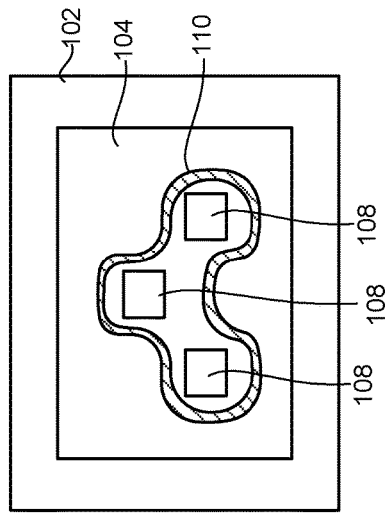
Figure 3C:
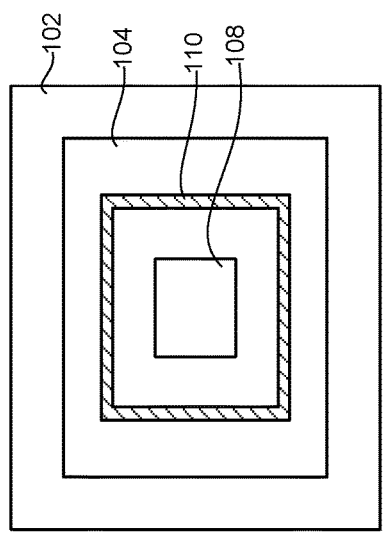
Figure 3D:
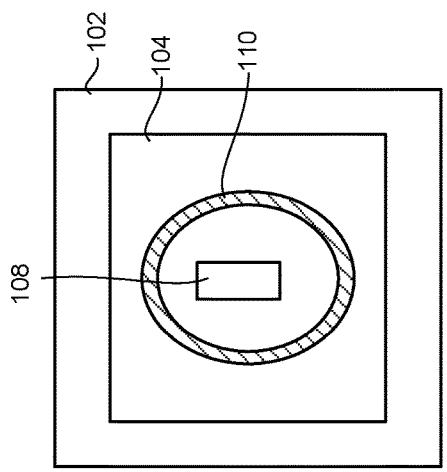
Figure 4A:
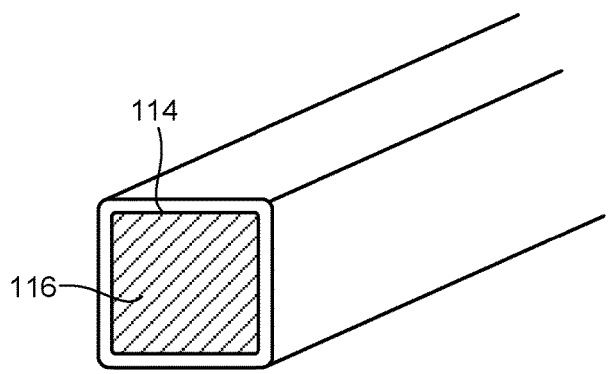
FIGS. 4A-4F are cross sectional perspective views of portions of example frames of the electronic device shown in FIG. 1, in accordance embodiments as described herein.
Figure 4B:
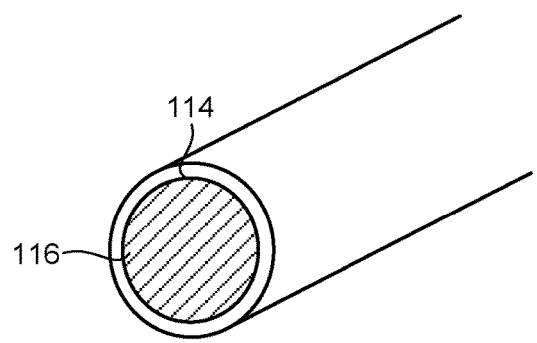
Figure 4C:
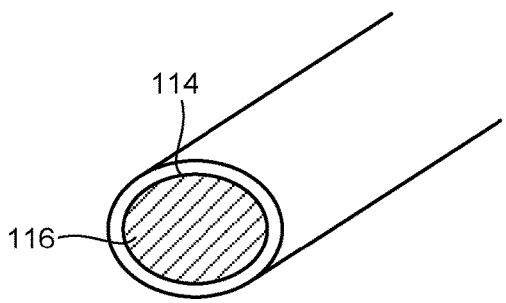
Figure 4D:
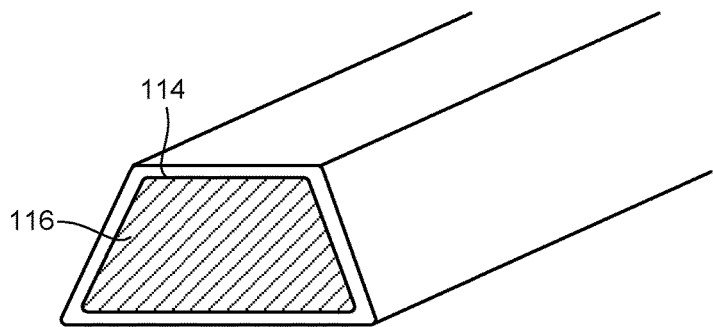
Figure 4E:
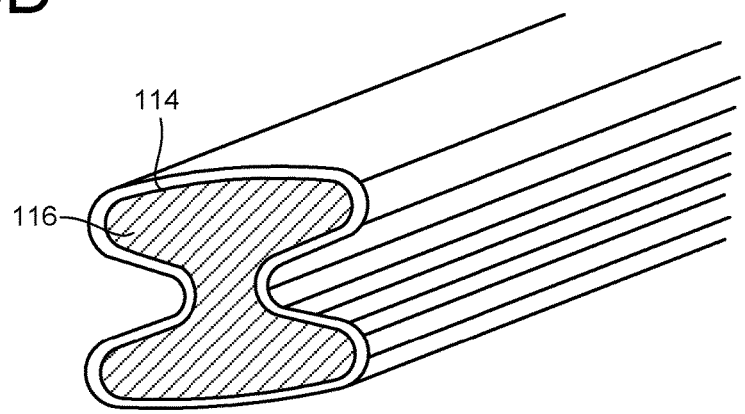
Figure 4F:
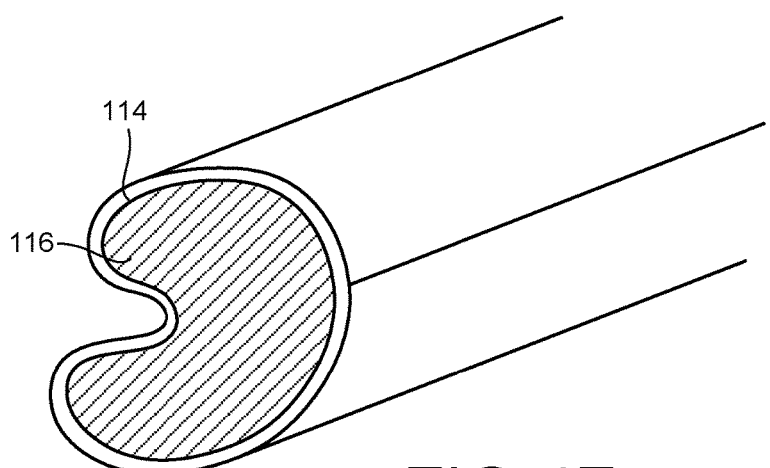

Returning to the side cross sectional views of the device shown in FIGS. 2B-2D, when no external force is applied, as shown in FIG. 2B, the resilient, elastic electrically conductive frame 110 is in an at rest, initial state, in which the frame 110 is not compressed and has a thickness $t_1$. As shown in FIG. 2C, in response to application of an external force, the resilient, elastic, electrically conductive frame 110 may be compressed, to a thickness $t_2$ (less than the thickness $t_1$). In this example, the externally applied force may be absorbed through the compression and/or deformation of the frame 110 made of an elastic, electrically conductive material, with the EMI shielding cover 112 pressed against the rigid surface 102 and the PCB 104 retaining its structural integrity, without flexing, in response to the application of the external force. This may prevent damage to the PCB 104 and/or the electronic component(s) 108 mounted on the PCB 104, and allow for connections between the PCB 104 and the frame 110 to remain intact, even in the event of the application of an external force. As shown in FIG. 2D, the resilient, elastic qualities of the material of the electrically conductive frame 110 may allow the frame 110 to return to its initial, at rest state, with a thickness of $t_1$, upon removal of the external force.

This ability of the resilient, elastic, electrically conductive frame 110 to absorb the externally applied force, rather than the externally applied force being transferred to the PCB 104 and causing damage to the PCB 104 and/or component(s) 108 mounted thereon, may improve reliability, durability, and operability of the electronic device, while still maintaining the required EMI shielding performance. Due to the conformal qualities associated with the resilient, electrically conductive frame 110, overall thickness of the electronic device may be reduced, and/or allow additional space may be made available to accommodate other components of the electronic device.

Figure 5:
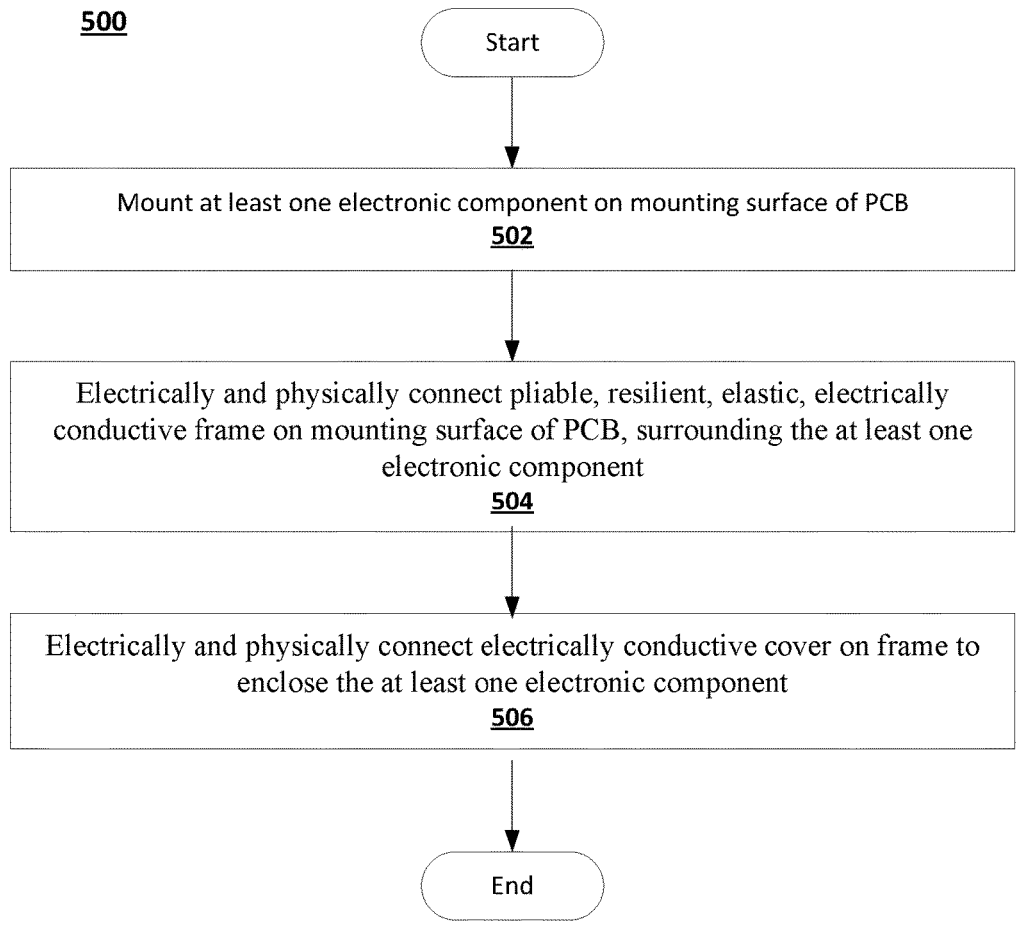
FIG. 5 is a flowchart of a method of installing an electrically-conductive frame and cover forming an EMI shield, in accordance with embodiments as broadly described herein.

FIG. 5 is a flow chart of an example method 500 for installing a flexible EMI shield, in accordance with embodiments as described herein. An electronic component may be mounted on a mounting surface of a PCB (502). A frame, such as, for example, the pliable, resilient, elastic, electrically conductive frame 110 described above with respect to FIGS. 2A-2C, 3A-3D and 4A-4F, may be physically connected and electrically connected to the mounting surface of the PCB (504), using, for example, an electrically conductive adhesive material or other material that maintains electrical continuity between the PCB and the frame. A cover, such as, for example, the electrically conductive cover 112 described above with respect to FIGS. 2A-2C, may be physically connected and electrically connected to the frame (506), using, for example, an electrically conductive adhesive material or other material that maintains electrical continuity between the PCB and the frame. In some implementations, the cover 112 may be electrically and physically connected to the frame 110 (506), and then the assembled frame 110 and cover 112 may be electrically and physically connected to the mounting surface of the PCB 104 (504). The pliable, resilient, elastic, electrically conductive frame, and the electrically conductive cover may form an EMI shield that reduces, or inhibits, or substantially eliminates, EMI leakage from the electronic component outside a volume defined by the frame, the cover, and the mounting surface of the PCB. As noted above, the elastically deformable qualities of the frame may allow the frame to deform, from an initial state to a compressed state in response to application of an external force, and to return to the initial state upon release of the external force. This arrangement may provide for effective EMI shielding, while also allowing the external force to be absorbed by the frame, rather than transmitted to the PCB and/or the electronic component mounted on the PCB, thus preventing damage to the PCB and/or the electronic component.

Figure 6:
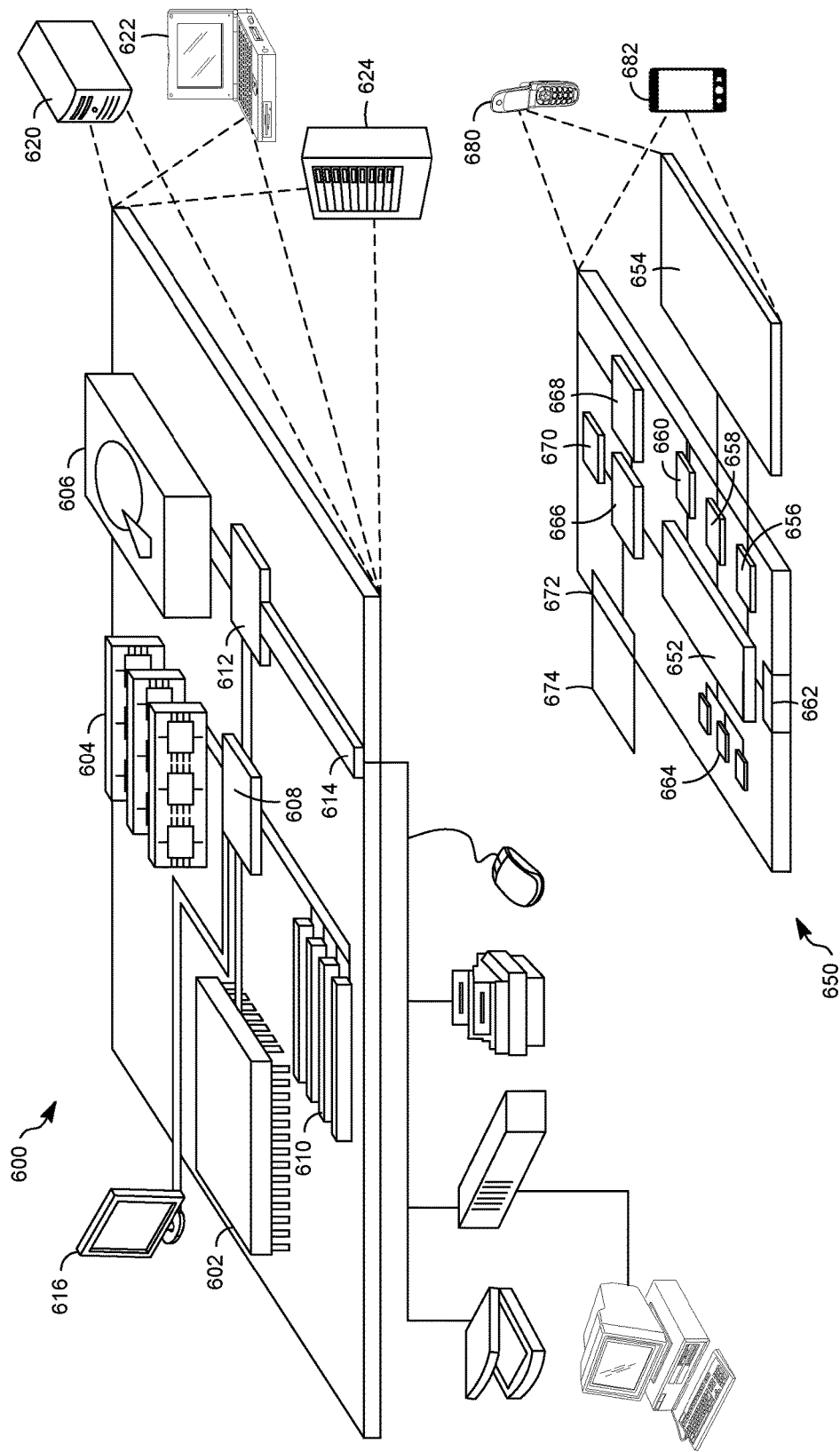
FIG. 6 shows an example of a computer device and a mobile computer device that can be used to implement the techniques described here.

FIG. 6 shows an example of a generic computer device 600 and a generic mobile computer device 650, which may be used with the techniques described herein. Computing device 600 is intended to represent various forms of digital computers, such as laptops, desktops, tablets, workstations, personal digital assistants, televisions, servers, blade servers, mainframes, and other appropriate computing devices. Computing device 650 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 600 includes a processor 602, memory 604, a storage device 606, a high-speed interface 608 connecting to memory 604 and high-speed expansion ports 610, and a low speed interface 612 connecting to low speed bus 614 and storage device 606. The processor 602 can be a semiconductor-based processor. The memory 604 can be a semiconductor-based memory. Each of the components 602, 604, 606, 608, 610, and 612, are interconnected using various busses, and may be mounted on a common motherboard or in other manners as appropriate. The processor 602 can process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be used, as appropriate, along with multiple memories and types of memory. Also, multiple computing devices 600 may be connected, with each device providing portions of the necessary operations (e.g., as a server bank, a group of blade servers, or a multi-processor system).

The memory 604 stores information within the computing device 600. In one implementation, the memory 604 is a volatile memory unit or units. In another implementation, the memory 604 is a non-volatile memory unit or units. The memory 604 may also be another form of computer-readable medium, such as a magnetic or optical disk.

The storage device 606 is capable of providing mass storage for the computing device 600. In one implementation, the storage device 606 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 604, the storage device 606, or memory on processor 602.

The high speed controller 608 manages bandwidth-intensive operations for the computing device 600, while the low speed controller 612 manages lower bandwidth-intensive operations. Such allocation of functions is exemplary only. In one implementation, the high-speed controller 608 is coupled to memory 604, display 616 (e.g., through a graphics processor or accelerator), and to high-speed expansion ports 610, which may accept various expansion cards (not shown). In the implementation, low-speed controller 612 is coupled to storage device 606 and low-speed expansion port 614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented as a standard server 620, or multiple times in a group of such servers. It may also be implemented as part of a rack server system 624. In addition, it may be implemented in a personal computer such as a laptop computer 622. Alternatively, components from computing device 600 may be combined with other components in a mobile device (not shown), such as device 650. Each of such devices may contain one or more of computing device 600, 650, and an entire system may be made up of multiple computing devices 600, 650 communicating with each other.

Computing device 650 includes a processor 652, memory 664, an input/output device such as a display 654, a communication interface 666, and a transceiver 668, among other components. The device 650 may also be provided with a storage device, such as a microdrive or other device, to provide additional storage. Each of the components 650, 652, 664, 654, 666, and 668, are interconnected using various buses, and several of the components may be mounted on a common motherboard or in other manners as appropriate.

The processor 652 can execute instructions within the computing device 650, including instructions stored in the memory 664. The processor may be implemented as a chipset of chips that include separate and multiple analog and digital processors. The processor may provide, for example, for coordination of the other components of the device 650, such as control of user interfaces, applications run by device 650, and wireless communication by device 650.

Processor 652 may communicate with a user through control interface 658 and display interface 656 coupled to a display 654. The display 654 may be, for example, a TFT LCD (Thin-Film-Transistor Liquid Crystal Display) or an OLED (Organic Light Emitting Diode) display, or other appropriate display technology. The display interface 656 may comprise appropriate circuitry for driving the display 654 to present graphical and other information to a user. The control interface 658 may receive commands from a user and convert them for submission to the processor 652. In addition, an external interface 662 may be provide in communication with processor 652, so as to enable near area communication of device 650 with other devices. External interface 662 may provide, for example, for wired communication in some implementations, or for wireless communication in other implementations, and multiple interfaces may also be used.

The memory 664 stores information within the computing device 650. The memory 664 can be implemented as one or more of a computer-readable medium or media, a volatile memory unit or units, or a non-volatile memory unit or units. Expansion memory 674 may also be provided and connected to device 650 through expansion interface 672, which may include, for example, a SIMM (Single In Line Memory Module) card interface. Such expansion memory 674 may provide extra storage space for device 650, or may also store applications or other information for device 650. Specifically, expansion memory 674 may include instructions to carry out or supplement the processes described above, and may include secure information also. Thus, for example, expansion memory 674 may be provide as a security module for device 650, and may be programmed with instructions that permit secure use of device 650. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 664, expansion memory 674, or memory on processor 652, that may be received, for example, over transceiver 668 or external interface 662.

Device 650 may communicate wirelessly through communication interface 666, which may include digital signal processing circuitry where necessary. Communication interface 666 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 668. In addition, short-range communication may occur, such as using a Bluetooth, WiFi, or other such transceiver (not shown). In addition, GPS (Global Positioning System) receiver module 670 may provide additional navigation- and location-related wireless data to device 650, which may be used as appropriate by applications running on device 650.

Device 650 may also communicate audibly using audio codec 660, which may receive spoken information from a user and convert it to usable digital information. Audio codec 660 may likewise generate audible sound for a user, such as through a speaker, e.g., in a handset of device 650. Such sound may include sound from voice telephone calls, may include recorded sound (e.g., voice messages, music files, etc.) and may also include sound generated by applications operating on device 650.

The computing device 650 may be implemented in a number of different forms, as shown in the figure. For example, it may be implemented as a cellular telephone 680. It may also be implemented as part of a smart phone 682, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An electronic device, comprising:
   a printed circuit board (PCB);
   at least one electronic component mounted on a mounting surface of the PCB;
   a frame made of a compressible, electrically conductive material, the frame including:
      a first end electrically connected to the mounting surface of the PCB and surrounding the at least one electronic component; and
      a second end defining an open top end portion of the frame; and
   a cover electrically connected to the second end of the frame, extending across the open top end portion of the frame, the cover being made of a rigid, electrically conductive material, the frame, the cover, and the PCB defining an electrically conductive enclosure surrounding the at least one component,
   wherein the compressible, electrically conductive material extends from the first end of the frame to the second end of the frame such that the compressible, electrically conductive material is coupled to the mounting surface of the PCB at the first end of the frame, and is coupled to the cover at the second end of the frame,
   wherein the cover includes a first surface facing a mounting surface of the PCB, and a second surface opposite the first surface, the second surface being in direct contact with one or more rigid components interposed between the second surface of the cover and the interior facing side of the housing, and
   wherein the frame is configured to compress, from an initial state to a compressed state, in response to application of an external force, and is configured to return to the initial state in response to release of the external force, while the cover is configured to remain rigid in response to the application of the external force and the release of the external force.

2. The device of claim 1, further comprising:
   a first electrically conductive adhesive layer physically connecting and electrically connecting the first end of the frame to the PCB; and
   a second electrically conductive adhesive layer physically connecting and electrically connecting the second end of the frame to the cover.

3. The device of claim 1, wherein the compressible, electrically conductive material of the frame includes:
   an elastically compressible core; and
   an electrically conductive sheath surrounding the elastically compressible core.

4. The device of claim 3, wherein the electrically conductive sheath is conformal to an outer periphery of the elastically compressible core, the electrically conductive sheath providing for electrical continuity between the PCB and the frame, and between the cover and the frame.

5. The device of claim 4, wherein the electrically conductive sheath is one of a fabric, a mesh, or a foil material.

6. The device of claim 3, wherein the elastically compressible core is configured to compress in the direction of the external force and absorb the external force as the frame compresses from the initial state to the compressed state, and to return to the initial state in response to release of the external force.

7. The device of claim 6, wherein the elastically compressible core is one of a foam material, a silicone material, or a urethane material.

8. The device of claim 3, wherein a cross section of the elastically compressible core is substantially constant along a length of the elastically compressible core defining a contour of the frame surrounding the at least one electronic component on the mounting surface of the PCB.

9. The device of claim 3, wherein a cross section of the elastically compressible core varies along a length of the elastically compressible core defining a contour of the frame surrounding the at least one electronic component on the mounting surface of the PCB.

10. The device of claim 1, wherein the compressible, electrically conductive material of the frame includes a metallized silicone material, including a silicone base material infused with conductive metal fibers.

11. The device of claim 1, wherein a contour of the frame defines a closed curve surrounding the at least one electronic component on the mounting surface of the PCB, the frame and the cover defining an electromagnetic interference (EMI) shield that inhibits EMI leakage from the at least one electronic component outside a volume defined by the frame, the cover and the mounting surface of the PCB.

12. The device of claim 1, further comprising:
   a first electrically conductive adhesive layer connecting the first end of the frame to the PCB; and
   a second electrically conductive adhesive layer connecting the second end of the frame to the cover.

13. The device of claim 3, wherein the electrically conductive sheath is conformal to an outer periphery of the elastically compressible core, the sheath providing for electrical continuity between the PCB and the frame, and between the cover and the frame.

14. The device of claim 1, wherein the frame is configured to compress in the direction of the external force in response to the application of the external force.

15. An electronic device, comprising:
   a printed circuit board (PCB);
   at least one electronic component mounted on a mounting surface of the PCB;
   a frame made of a compressible, electrically conductive material, the frame including:
      a first end electrically connected to the mounting surface of the PCB and surrounding the at least one electronic component; and
      a second end defining an open top end portion of the frame; and
   a cover electrically connected to the second end of the frame, extending across the open top end portion of the frame, the cover being made of a rigid, electrically conductive material, the frame, the cover, and the PCB defining an electrically conductive enclosure surrounding the at least one component,
   wherein the cover includes a first surface facing the mounting surface of the PCB, and a second surface opposite the first surface, the second surface being directly connected to an interior facing side of a housing in which the electronic device is received, and
   wherein the frame is configured to compress, from an initial state to a compressed state, in response to application of an external force, and is configured to return to the initial state in response to release of the external force, while the cover is configured to remain rigid in response to the application of the external force and the release of the external force.

16. The device of claim 15, further comprising:
a first electrically conductive adhesive layer physically connecting and electrically connecting the first end of the frame to the PCB; and
a second electrically conductive adhesive layer physically connecting and electrically connecting the second end of the frame to the cover.

17. The device of claim 15, wherein the compressible, electrically conductive material of the frame includes:
an elastically compressible core; and
an electrically conductive sheath surrounding the elastically compressible core, wherein the electrically conductive sheath is conformal to an outer periphery of the elastically compressible core, the electrically conductive sheath providing for electrical continuity between the PCB and the frame, and between the cover and the frame.

18. The device of claim 17, wherein the elastically compressible core is configured to compress in the direction of the external force and absorb the external force as the frame compresses from the initial state to the compressed state, and to return to the initial state in response to release of the external force.

19. The device of claim 18, wherein the elastically compressible core is one of a foam material, a silicone material, or a urethane material, and the electrically conductive sheath is one of a fabric, a mesh, or a foil material.

20. The device of claim 17, wherein a cross section of the elastically compressible core is substantially constant along a length of the elastically compressible core defining a contour of the frame surrounding the at least one electronic component on the mounting surface of the PCB.

21. The device of claim 17, wherein a cross section of the elastically compressible core varies along a length of the elastically compressible core defining a contour of the frame surrounding the at least one electronic component on the mounting surface of the PCB.

22. The device of claim 15, wherein the compressible, electrically conductive material of the frame includes a metallized silicone material, including a silicone base material infused with conductive metal fibers.

23. The device of claim 15, wherein a contour of the frame defines a closed curve surrounding the at least one electronic component on the mounting surface of the PCB, the frame and the cover defining an electromagnetic interference (EMI) shield that inhibits EMI leakage from the at least one electronic component outside a volume defined by the frame, the cover and the mounting surface of the PCB.

24. The device of claim 15, wherein the compressible, electrically conductive material extends from the first end of the frame to the second end of the frame such that the compressible, electrically conductive material is coupled to the mounting surface of the PCB at the first end of the frame, and is coupled to the cover at the second end of the frame.

* * * * *